United States Patent
Chiu et al.

(10) Patent No.: US 8,050,319 B2
(45) Date of Patent: Nov. 1, 2011

(54) SIGNAL GENERATING APPARATUS AND RELATED METHOD

(75) Inventors: Shu-Yeh Chiu, Hsinchu County (TW); Po-Chiang Wu, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 645 days.

(21) Appl. No.: 12/175,462

(22) Filed: Jul. 18, 2008

(65) Prior Publication Data
US 2009/0185614 A1    Jul. 23, 2009

(30) Foreign Application Priority Data
Jul. 18, 2007   (TW) .............................. 96126214 A (51) Int. Cl.
*H03K 7/08* (2006.01)
(52) U.S. Cl. ........................................ 375/238; 332/109
(58) Field of Classification Search .................. 375/238; 330/10, 251; 323/282; 332/109
See application file for complete search history.

(56) References Cited

U.S. PATENT DOCUMENTS

| | | | |
|---|---|---|---|
| 5,119,045 A | 6/1992 | Sato | |
| 7,209,518 B1* | 4/2007 | Lubomirsky | 375/238 |
| 2005/0285582 A1* | 12/2005 | Azuma et al. | 323/282 |
| 2008/0181293 A1* | 7/2008 | Kris | 375/238 |
| 2009/0092267 A1* | 4/2009 | Wu et al. | 381/120 |

* cited by examiner

*Primary Examiner* — David C. Payne
*Assistant Examiner* — Leon-Viet Nguyen
(74) *Attorney, Agent, or Firm* — Winston Hsu; Scott Margo (57) ABSTRACT

The signal generating apparatus includes a signal modulating unit, a selection signal generating unit, and a phase adjusting unit. The signal modulating unit is utilized for processing a modulation upon an input signal to generate a modulated signal. The selection signal generating unit is utilized for generating at least a first selection signal. The phase adjusting unit is coupled to the signal modulating unit and the selection signal generating unit, and is utilized for receiving the modulated signal and adjusting a pulse width of the modulated signal to generate an output signal according to the first selection signal.

15 Claims, 6 Drawing Sheets

SIGNAL GENERATING APPARATUS AND RELATED METHOD

BACKGROUND OF THE INVENTION

1. Field of the Invention

The present invention relates to a signal generating scheme, and more particularly, to a signal generating apparatus and related method for performing a phase modulation upon a pulse width modulation signal.

2. Description of the Prior Art

A digital power amplifier (also called a class-D power amplifier) has an advantage of high efficiency and therefore is generally applied to a variety of audio processing equipments. A digital audio power amplifier utilizes a pulse width modulation (PWM) circuit to generate a pulse width modulation signal according to a digital input signal, for controlling the operation of a power output stage.

Figure 1:
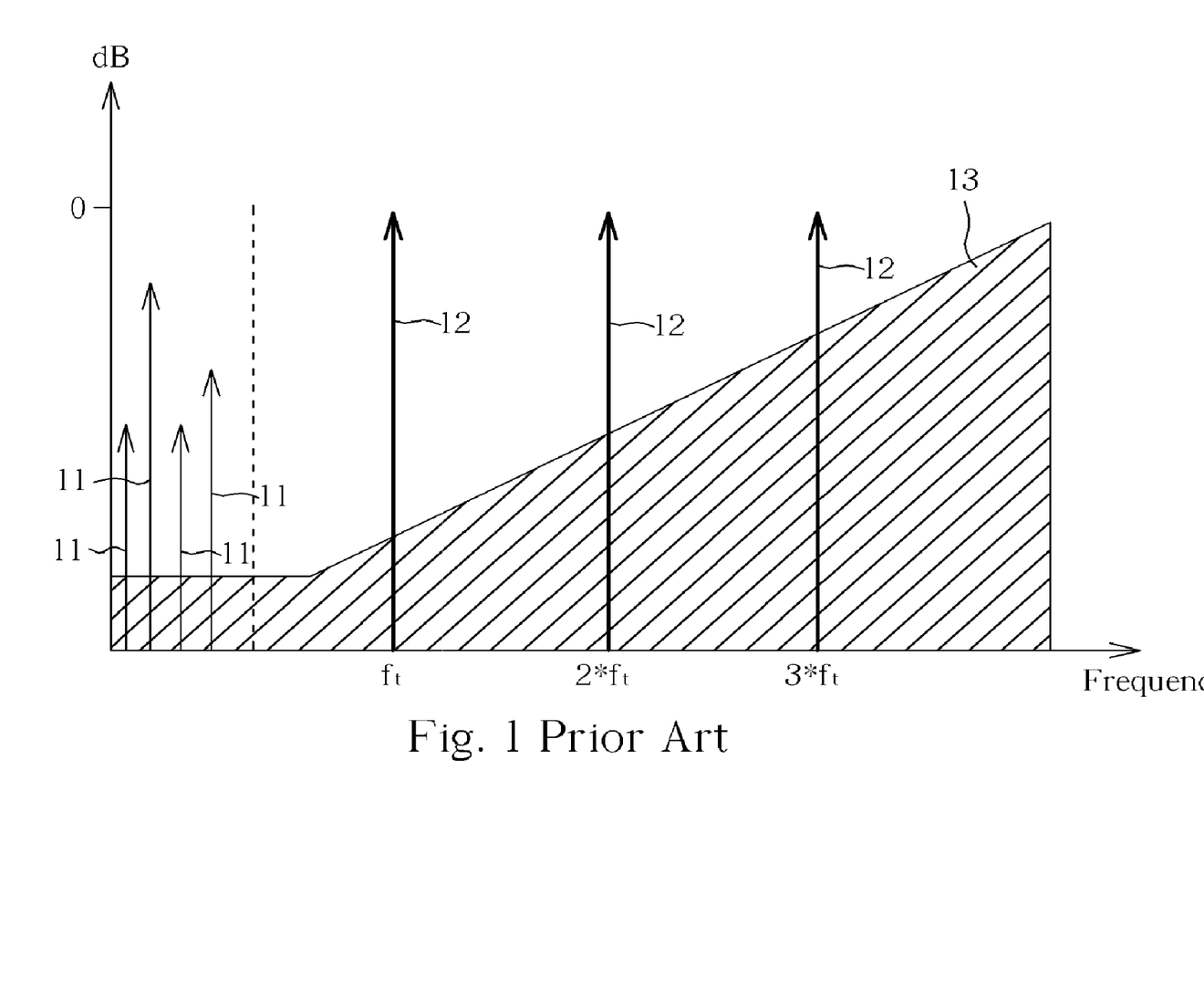
FIG. 1 is a spectrum diagram showing a pulse width modulation signal outputted by a prior art PWM circuit.

Please refer to FIG. 1. FIG. 1 is a spectrum diagram showing a pulse width modulation signal $S_{pulse}$ outputted by a prior art PWM circuit. In the time domain, a period of the pulse width modulation signal $S_{pulse}$ equals $1/f_t$, where $f_t$ is a carrier frequency of the pulse width modulation signal $S_{pulse}$. The PWM circuit performs a PWM operation upon each cycle of the pulse width modulation signal $S_{pulse}$, so each pulse width of the pulse width modulation signal $S_{pulse}$ may be different from each other. However, in this spectrum diagram, the pulse width modulation signal $S_{pulse}$ comprises three components. The first component includes the original data signal pulses 11 that arise in base band. The second component includes carrier frequencies 12, i.e. the frequencies $f_t$, $2*f_t$, and $3*f_t$. The third component includes noise components 13 (i.e. oblique lines) shown in FIG. 1. As a result, by observing FIG. 1, it can be seen that a problem caused by serious electromagnetic interference (EMI) is introduced into the noise components 13 and the carrier frequencies 12.

SUMMARY OF THE INVENTION

Therefore one of the objectives of the present invention is to provide a signal generating apparatus and related method for performing a phase modulation upon a pulse width modulation signal, to solve the above-mentioned problems.

According an embodiment of the claimed invention, a signal generating apparatus is disclosed. The signal generating apparatus comprises a signal modulating unit, a selection signal generating unit, and a phase adjusting unit. The signal modulating unit is utilized for processing a modulation upon an input signal to generate a modulated signal, and the selection signal generating unit is utilized for generating at least a first selection signal. The phase adjusting unit is coupled to the signal modulating unit and the selection signal generating unit, and is utilized for receiving the modulated signal and adjusting a pulse width of the modulated signal to generate an output signal according to the first selection signal.

According to an embodiment of the claimed invention, a signal generating method is further disclosed. The signal generating method includes: processing a modulation upon an input signal to generate a modulated signal; generating at least a first selection signal; and adjusting a pulse width of the modulated signal to generate an output signal according to the modulated signal and the first selection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
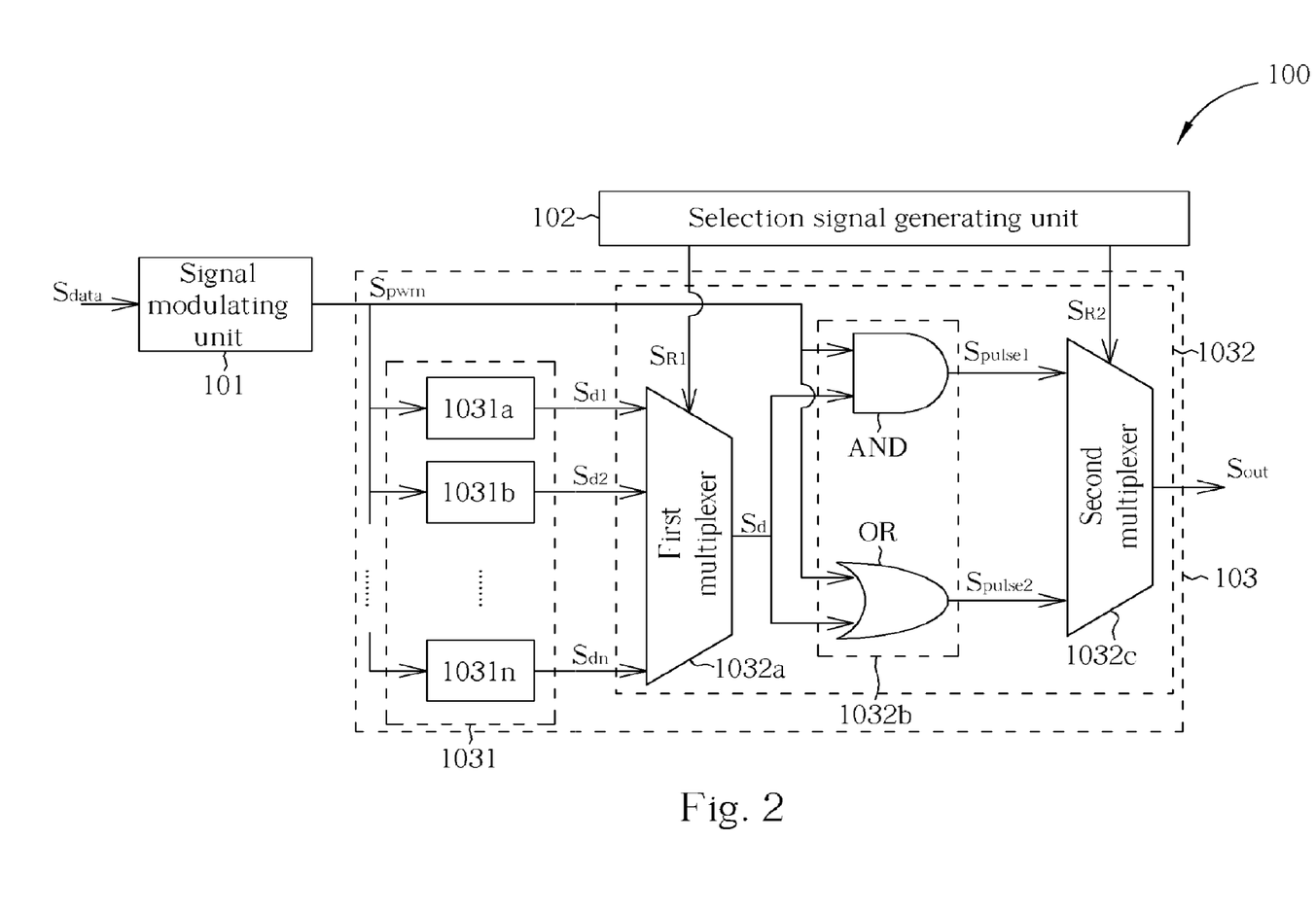
FIG. 2 is a diagram illustrating a signal generating apparatus according to an embodiment of the present invention.

Please refer to FIG. 2. FIG. 2 is a diagram illustrating a signal generating apparatus 100 according to an embodiment of the present invention. The signal generating apparatus 100 comprises a signal modulating unit 101, a selection signal generating unit 102, and a phase adjusting unit 103. The signal modulating unit 101 is utilized for processing a modulation upon an input signal $S_{data}$ to generate a modulated signal $S_{PWM}$. The selection signal generating unit 102 is utilized for generating a first selection signal $S_{R1}$ and a second selection signal $S_{R2}$. The phase adjusting unit 103 is coupled to the signal modulating unit 101 and the selection signal generating unit 102, and the phase adjusting unit 103 is utilized for receiving the modulated signal $S_{PWM}$ and adjusting a pulse width of the modulated signal $S_{PWM}$ to generate an output signal $S_{out}$ according to the first selection signal $S_{R1}$ and the second selection signal $S_{R2}$. The phase adjusting unit 103 comprises a phase delayer 1031 and a selection circuit 1032. The phase delayer 1031 is used for generating a plurality of delay signals $S_{d1}$-$S_{dn}$ according to the modulated signal $S_{PWM}$, where the delay signals $S_{d1}$-$S_{dn}$ correspond to different phases, respectively. The selection circuit 1032 comprises a first multiplexer 1032a, a logic circuit 1032b, and a second multiplexer 1032c. The first multiplexer 1032a is coupled to the phase delayer 1031 and the selection signal generating unit 102, and the first multiplexer 1032a is used for selecting a specific delay signal $S_d$ from the delay signals $S_{d1}$-$S_{dn}$ according to the first selection signal $S_{R1}$ and then outputting the specific delay signal $S_d$. The logic circuit 1032b is coupled to the first multiplexer 1032a and the signal modulating unit 101 and is utilized for performing a logic operation upon the modulated signal $S_{PWM}$ and the specific delay signal $S_d$ to generate a first pulse signal $S_{pulse1}$ and a second pulse signal $S_{pulse2}$. The second multiplexer 1032c, coupled to the logic circuit 1032b and the selection signal generating unit 102, is utilized for selecting a specific pulse signal from the first pulse signal $S_{pulse1}$ and second pulse signal $S_{pulse2}$ as the output signal $S_{out}$ according to the second selection signal $S_{R2}$. Please note that in this embodiment, the logic circuit 1032b of the signal generating apparatus 100 comprises an AND gate and an OR gate. The AND gate, coupled to the modulated signal $S_{PWM}$ and the specific delay signal $S_d$, is utilized for generating the first pulse signal $S_{pulse1}$; the OR gate, coupled to the modulated signal $S_{PWM}$ and the specific delay signal $S_d$, is utilized for generating the second pulse signal $S_{pulse2}$. The second multiplexer 1032c selects one of the first pulse signal $S_{pulse1}$ and second pulse signal $S_{pulse2}$ as the output signal $S_{out}$ according to the second selection signal $S_{R2}$. Moreover, describing the spirit of the present invention, in another embodiment of the present invention, the signal modulating unit 101 can be a pulse width modulation (PWM) unit. For example, the signal modulating unit 101 processes the input signal $S_{data}$ having a sample frequency $f_s$ and generates the modulated signal $S_{PWM}$ having a sample frequency $f_{s1}$. The selection signal generating unit 102 adjusts the pulse width of the modulated signal $S_{PWM}$ according to a frequency $f_r$. That is to say, the selection signal generating unit 102 is arranged to adjust the pulse width of the modulated signal $S_{PWM}$ in a period of $1/f_r$, wherein the relationship between $f_{s1}$ and $f_r$ satisfies: $f_{s1}=Nf_r$, where N is meant to be any integer. For instance, if the frequency $f_r$ equals 384 KHz and the integer N is 128, the sample frequency $f_{s1}$ of the modulated signal $S_{PWM}$ equals 49.152 MHz. However, this is not intended to be a limitation of the present invention: any digital PWM unit can be applied to the present invention and falls within the scope of the present invention.

In another embodiment, the selection signal generating unit 102 can be a random number generating unit. The first selection signal $S_{R1}$ and the second selection signal $S_{R2}$, which are generated by the selection signal generating unit 102, are random control signals generated by the random number generating unit. However, this is simply an example for illustrative and should not limit the scope of the present invention.

Figure 3:
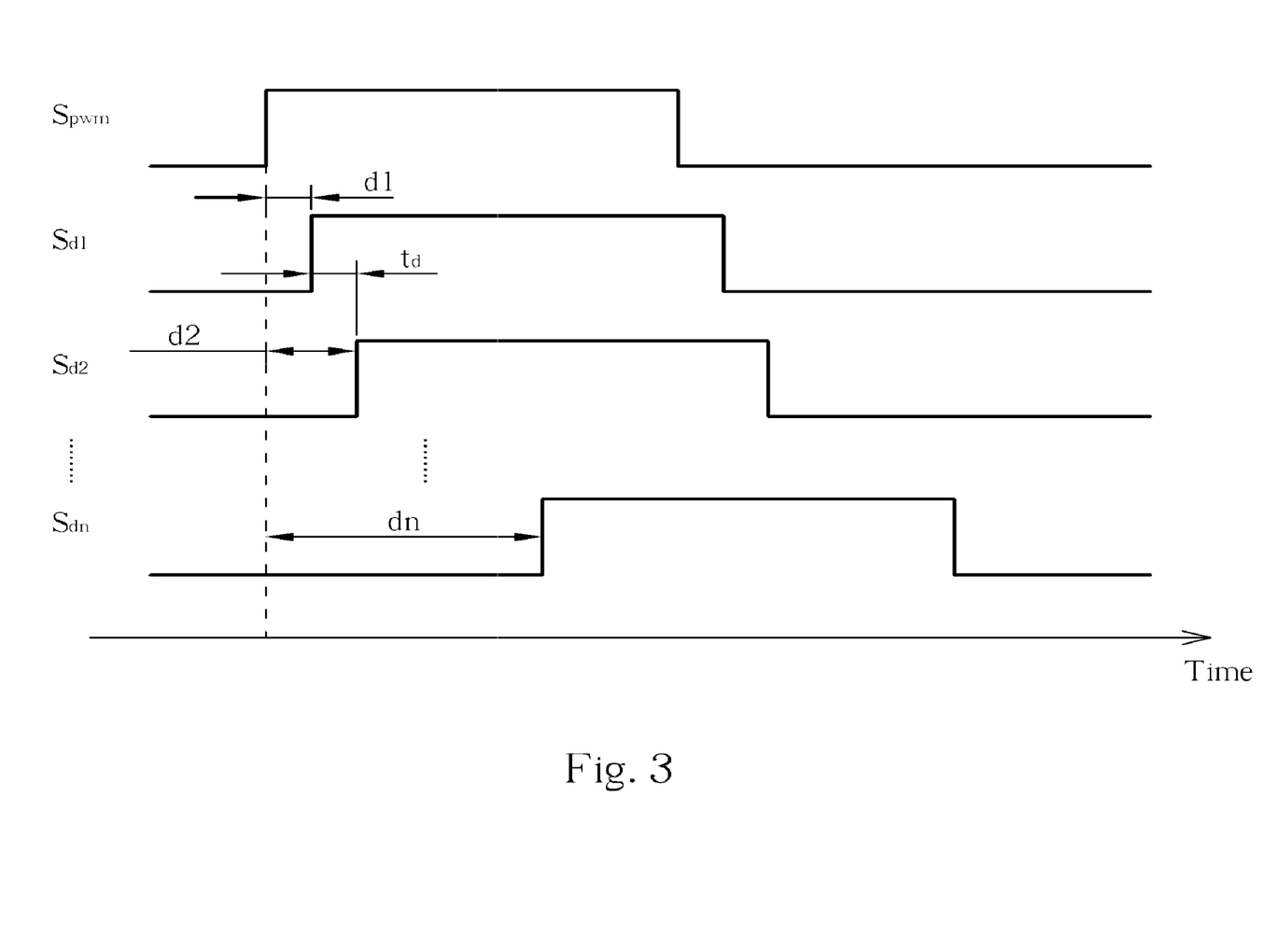
FIG. 3 is a timing diagram illustrating the modulated signal $S_{PWM}$, the delay signals $S_{d1}$-$S_{dn}$, the pulse signals $S_{pulse1}$ and $S_{pulse2}$, and the output signal $S_{out}$ generated by the signal generating apparatus shown in FIG. 2.

Please refer to FIG. 3. FIG. 3 is a timing diagram illustrating the modulated signal $S_{PWM}$, the delay signals $S_{d1}$-$S_{dn}$, the pulse signals $S_{pulse1}$ and $S_{pulse2}$, and the output signal $S_{out}$ generated by the signal generating apparatus 100 shown in FIG. 2. In this embodiment, describing the spirit of the present invention more clearly, the way of adjusting the phase of the modulated signal $S_{PWM}$ of the signal generating apparatus 100 is explained as below: the selection signal generating unit 102 adjusts the phase of the modulated signal $S_{PWM}$ generated by the signal modulating unit 101 to generate the output signal $S_{out}$ according to the frequency $f_r$. The modulated signal $S_{PWM}$ generated by the signal modulating unit 101 is respectively delayed with time intervals d1-dn to generate a plurality of delay signals $S_{d1}$-$S_{dn}$ via a plurality of delay circuits 1031a-1031n within the phase delayer 1031. Please note that, in this embodiment, the delayed time intervals d1-dn can be appropriately adjusted according to design requirements. In other words, the delayed time intervals d1-dn can be identical or mutually different. For the purpose of clarity, in this embodiment, the delay signals $S_{d1}$-$S_{dn}$ generated by the delay circuits 1031a-1031n have $2^N$ different phases respectively, where N is an integer. For the delay signals $S_{d1}$-$S_{dn}$, a time difference $t_d$ (i.e. a phase difference) between every two neighboring delay signals is identical, as shown in FIG. 3. For instance, a time difference between the delay signals $S_{d1}$ and $S_{d2}$ is $t_d$, and a time difference between the delay signals $S_{d2}$ and $S_{d3}$ is also $t_d$, and so on. In this example, the time difference $t_d$ between every two neighboring delay signals equals $1/(f_r*(2^N))$, where N is an integer. It should be noted that, this is simply an example for illustrative purposes and is not a limitation for practical designs of the delayed time intervals d1-dn of the phase delayer 1031. When the $2^N$ delay signals $S_{d1}$-$S_{dn}$ are transmitted to the first multiplexer 1032a, the first multiplexer 1032a selects one of the $2^N$ delay signals $S_{d1}$-$S_{dn}$ as the delay signal $S_d$ according to the first selection signal $S_{R1}$. In other words, when the first selection signal $S_{R1}$ is a random signal, an output signal of the first multiplexer 1032a is also random. The logic circuit 1032b then performs a logic AND operation and a logic OR operation upon the delay signal $S_d$ and the modulated signal $S_{PWM}$ to respectively generate the first pulse signal $S_{pulse1}$ and the second pulse signal $S_{pulse2}$. Consequently, the first pulse signal $S_{pulse1}$ includes $2^N$ possible output results that are logic AND operation results of the signals $S_{PWM}$ and $S_{d1}$, $S_{PWM}$ and $S_{d2}$, ..., $S_{PWM}$ and $S_{dn}$, respectively. The second pulse signal $S_{pulse2}$ also includes $2^N$ possible output results that are logic OR operation results of the signals $S_{PWM}$ and $S_{d1}$, $S_{PWM}$ and $S_{d2}$, ..., $S_{PWM}$ and $S_{dn}$, respectively. The second multiplexer 1032c outputs the first pulse signal $S_{pulse1}$ or the second pulse signal $S_{pulse2}$ to generate the output signal $S_{out}$ according to the second selection signal $S_{R2}$. Therefore the output signal $S_{out}$ includes $2*2^N$ possible output results.

Figure 4:
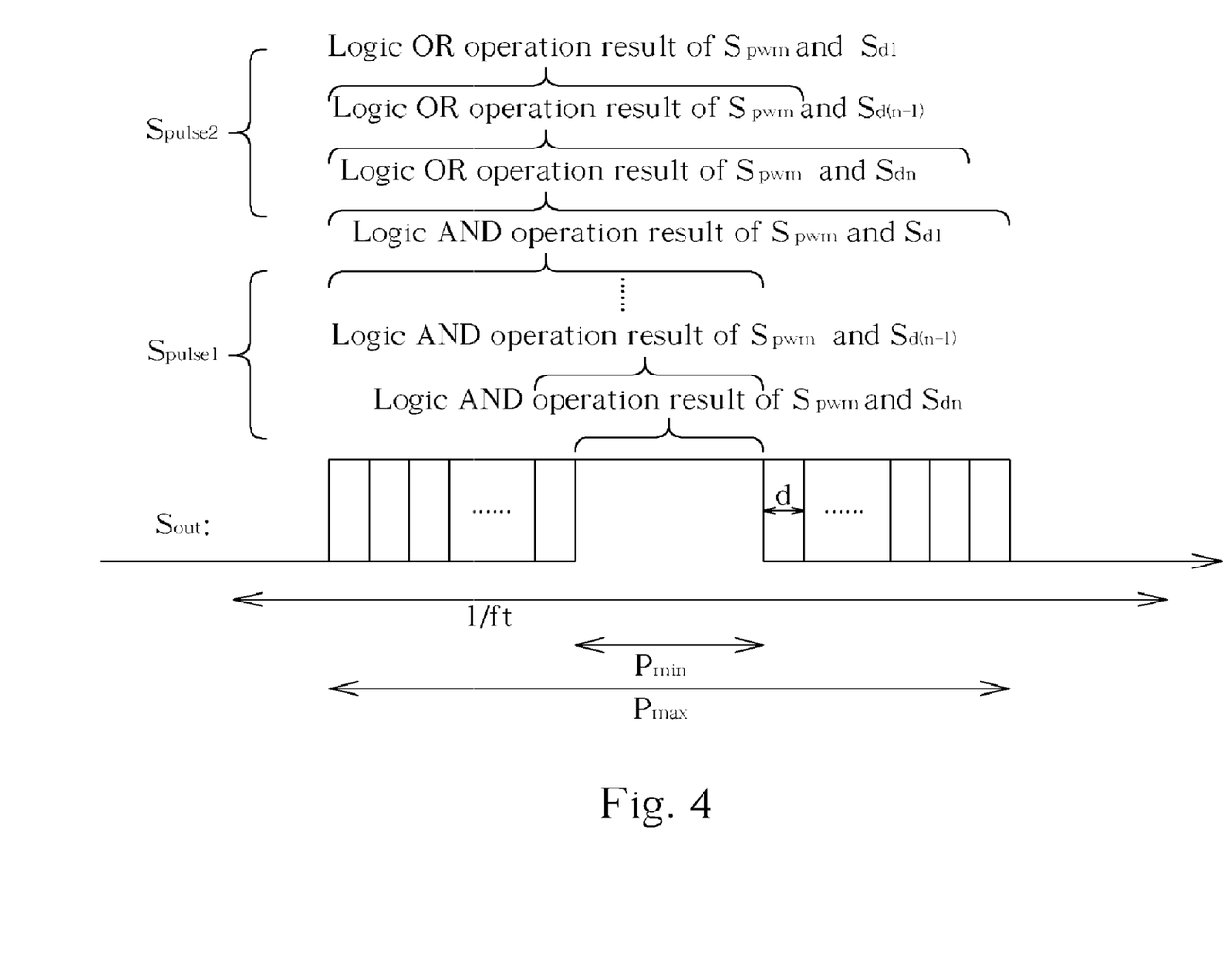
FIG. 4 is a diagram illustrating possible pulse widths of the output signal $S_{out}$ generated by the signal generating apparatus shown in FIG. 2.

As mentioned above, when the second multiplexer 1032c selects the first pulse signal $S_{pulse1}$ as the output signal $S_{out}$, the pulse width of the output signal $S_{out}$ becomes wider than that of the input signal $S_{data}$. Otherwise, when the second multiplexer 1032c selects the second pulse signal $S_{pulse2}$ as the output signal $S_{out}$, the pulse width of the output signal $S_{out}$ becomes narrower than that of the input signal $S_{data}$, as shown in FIG. 4. FIG. 4 is a diagram illustrating possible pulse widths of the output signal $S_{out}$ generated by the signal generating apparatus 100 shown in FIG. 2. In this embodiment of the present invention, after the signal generating apparatus 100 adjusts the pulse width, the pulse width of the output signal $S_{out}$ will vary randomly between a maximum pulse width $P_{max}$ and a minimum pulse width $P_{min}$ during each cycle time ($1/f_r$), where the maximum pulse width $P_{max}$ is generated by the logic OR operation result of the signals $S_{PWM}$ and $S_{dn}$ and the minimum pulse width $P_{min}$ is generated by the logic AND operation result of the signals $S_{PWM}$ and $S_{dn}$. As shown in this figure, a minimum difference between the pulse widths of neighbor cycles of the output signal $S_{out}$ equals d while a maximum difference between the pulse widths of the neighbor cycles of the output signal $S_{out}$ equals the maximum pulse width $P_{max}$ minus the minimum pulse width $P_{min}$. The reason of the pulse width of each cycle being varied is that the pulse widths of the output signal $S_{out}$ are randomly determined by the first selection signal $S_{R1}$ and the second selection signal $S_{R2}$, that are generated by the selection signal generating unit 102. The objectives of the AND gate and the OR gate in this embodiment is to respectively decrease or increase the pulse widths of the output signal $S_{out}$ according to the logic AND operation and the logic OR operation; the minimum difference d should be smaller than $1/f_{s1}$ ($f_{s1}$ is the sample frequency of the modulated signal $S_{PWM}$). Of course, the number of the delay signals $S_{d1}$-$S_{dn}$ mentioned above can also be a random number.

Figure 5:
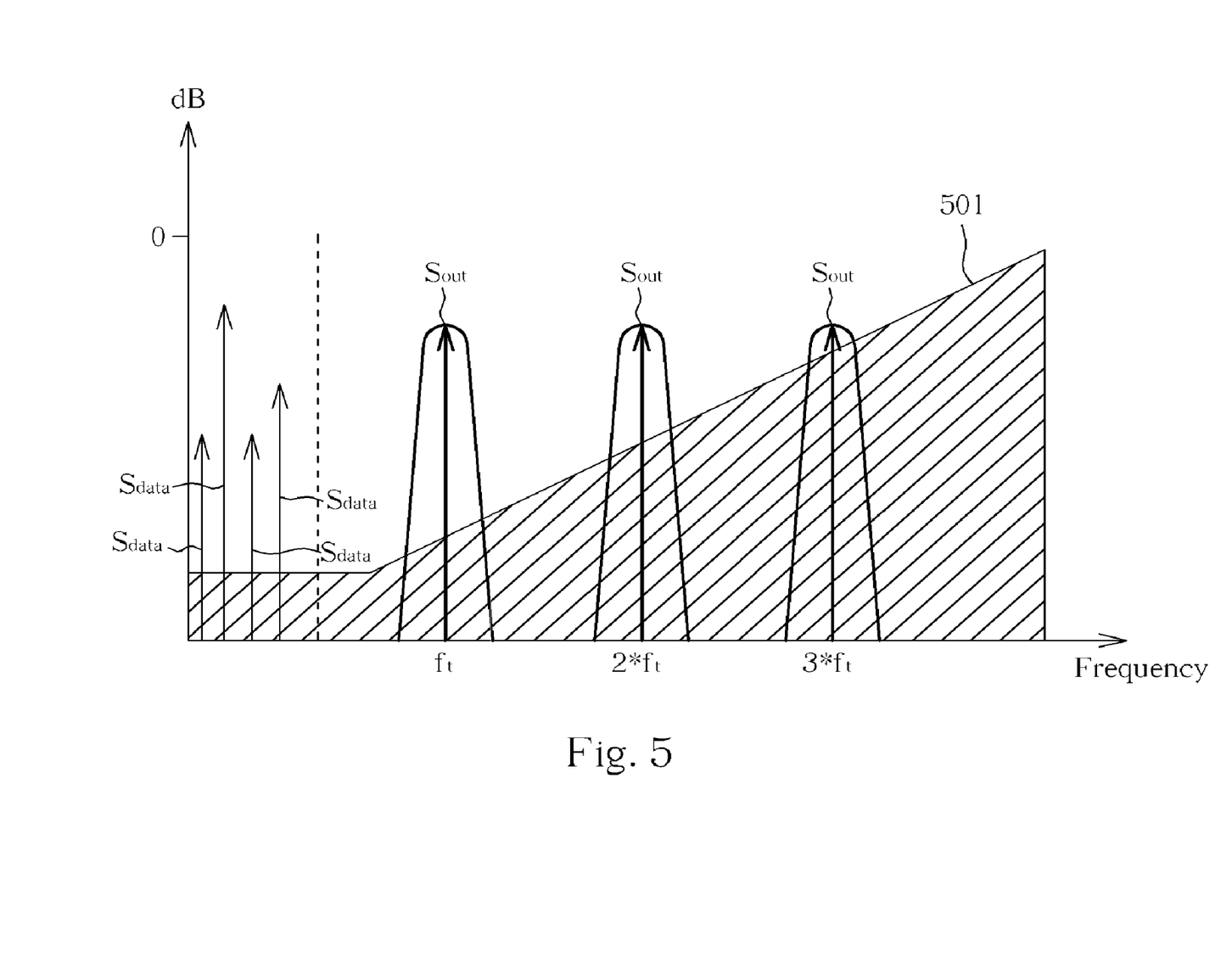
FIG. 5 is a spectrum diagram illustrating the input signal $S_{data}$ and the output signal $S_{out}$ of the signal generating apparatus shown in FIG. 2.

Therefore, as shown in FIG. 5, energy of the output signal $S_{out}$ will not concentrate on the frequencies $f_r$, $2*f_r$, and $3*f_r$. This energy will disperse to the frequencies $f_r$, $2*f_r$, and $3*f_r$ nearby, where the frequency $f_r$ is a carrier frequency of the input signal $S_{data}$. FIG. 5 shows a spectrum diagram illustrating the input signal $S_{data}$ and the output signal $S_{out}$ of the signal generating apparatus 100 shown in FIG. 2. A curve 501 represents a distribution of noise components over the frequency domain (i.e. oblique lines of FIG. 5). Please note that, those skilled in the art should appreciate that electro magnetic interference (EMI) due to the noise components (i.e. the curve 501), from which the output signal $S_{out}$ suffers, is decreased when the energy of the output signal $S_{out}$ does not concentrate on the frequencies $f_r$, $2*f_r$, and $3*f_r$. In other words, the related art technique suffers from serious EMI caused by the noise components (i.e. the curve 501) because the energy of the output signal $S_{out}$ concentrates on the frequencies $f_t$, $2*f_t$, and $3*f_t$. Additionally, since it is well-known to one skilled in this art how the noise components (the curve 501) interferes with the output signal $S_{out}$, further description is not detailed here. In addition, in this embodiment, the output signal $S_{out}$ of the signal generating apparatus 100 is utilized for driving a power output stage (not shown in FIG. 2); since the way for utilizing a pulse width modulation signal to control a power output stage is familiar to those skilled in this art, further explanation is also not detailed further.

Figure 6:
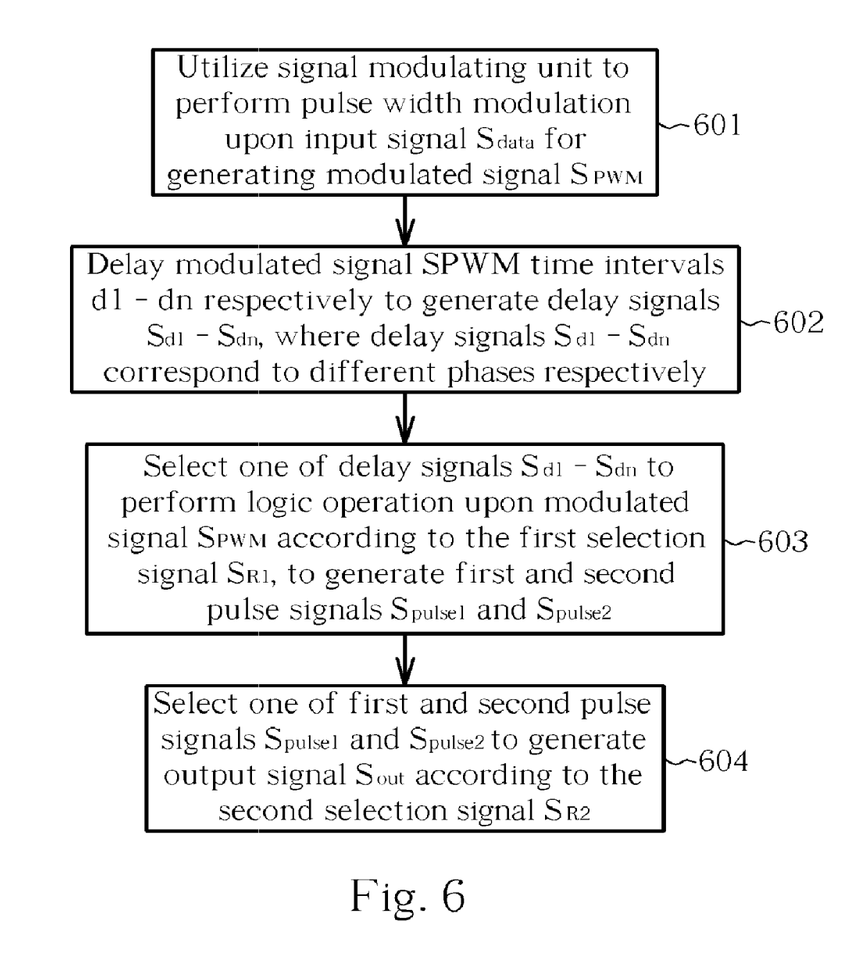
FIG. 6 is a flowchart of a signal generating method according to an embodiment of the present invention.

Please refer to FIG. 6. FIG. 6 is a flowchart of a signal generating method according to an embodiment of the present invention. For describing the spirit of the present invention more clearly, the signal generating method can be accomplished by using the signal generating apparatus 100 shown in FIG. 2. The signal generating method comprises the following steps:

Step 601: Utilize the signal modulating unit 101 to perform a pulse width modulation upon the input signal $S_{data}$ for generating the modulated signal $S_{PWM}$.

Step 602: Delay the modulated signal $S_{PWM}$ the time intervals d1-dn respectively to generate the delay signals $S_{d1}$-$S_{dn}$, where the delay signals $S_{d1}$-$S_{dn}$ correspond to different phases respectively.

Step 603: Select one of the delay signals $S_{d1}$-$S_{dn}$ to perform a logic operation upon the modulated signal $S_{PWM}$ according to the first selection signal $S_{R1}$ to generate the first and second pulse signals $S_{pulse1}$ and $S_{pulse2}$.

Step 604: Select one of the first and second pulse signals $S_{pulse1}$ and $S_{pulse2}$ to generate the output signal $S_{out}$ according to the second selection signal $S_{R2}$.

In Step 602, the delay signals $S_{d1}$-$S_{dn}$ have $2^N$ phases separately, where N can be any integer. Among all the delay signals $S_{d1}$-$S_{dn}$, in this embodiment, the time difference $t_d$ (i.e. the phase difference) between each neighboring delay signal is identical, as shown in FIG. 3. Furthermore, the time difference $t_d$ between each neighboring delay signal equals $1/(f_t*(2^N))$. In Step 603, the first pulse signal $S_{pulse1}$ includes $2^N$ possible output results, that are the logic AND operation results of the signals $S_{PWM}$ and $S_{d1}$, $S_{PWM}$ and $S_{d2}$, ..., and $S_{PWM}$ and $S_{dn}$; the second pulse signal $S_{pulse2}$ also includes $2^N$ possible output results, that are the logic OR operation results of the signals $S_{PWM}$ and $S_{d1}$, $S_{PWM}$ and $S_{d2}$, ..., and $S_{PWM}$ and $S_{dn}$. Therefore, in Step 604, the energy of the output signal $S_{out}$ will not concentrate on the frequencies $f_t$, $2*f_t$, and $3*f_t$ but disperse to the frequencies $f_t$, $2*f_t$, and $3*f_t$ nearby (as shown in FIG. 5), where the frequency $f_t$ is the carrier frequency of the input signal $S_{data}$.

Those skilled in the art will readily observe that numerous modifications and alterations of the device and method may be made while retaining the teachings of the invention.

What is claimed is:

1. A signal generating apparatus, comprising:
   a signal modulating unit, for processing a modulation upon an input signal to generate a modulated signal;
   a selection signal generating unit, for generating at least a first selection signal; and
   a phase adjusting unit, coupled to the signal modulating unit and the selection signal generating unit, for receiving the modulated signal and adjusting a pulse width of the modulated signal to generate an output signal according to the first selection signal, wherein the phase adjusting unit comprises:
      a logic circuit, for adjusting the pulse width of the modulated signal by performing a logic operation upon the modulated signal and a specific delay signal;
      a phase delayer, for generating a plurality of delay signals according to the modulated signal, where the delay signals correspond to different phases respectively; and
      a selection circuit, coupled to the phase delayer and the selection signal generating unit, for generating the output signal according to the delay signals and the first selection signal, wherein the selection circuit comprises:
         a first multiplexer for selecting the specific delay signal from the delay signals according to the first selection signal, and the output signal is generated according to the specific delay signal.

2. The signal generating apparatus of claim 1, wherein the logic circuit comprises an AND gate for performing the logic operation.

3. The signal generating apparatus of claim 1, wherein the logic circuit comprises an OR gate for performing the logic operation.

4. The signal generating apparatus of claim 1, wherein the selection signal generating unit further generates a second selection signal;
   the logic circuit performs a logic operation upon the modulated signal and the specific delay signal to generate a plurality of pulse signals; and the selection circuit comprises:
   a second multiplexer, for selecting a specific pulse signal from the pulse signals as the output signal according to the second selection signal.

5. The signal generating apparatus of claim 4, wherein the logic circuit comprises:
   an AND gate, coupled to the modulated signal and the specific delay signal, for generating a first pulse signal; and
   an OR gate, coupled to the modulated signal and the specific delay signal, for generating a second pulse signal;
   wherein the second multiplexer selects one of the first and second pulse signals as the output signal according to the second selection signal.

6. The signal generating apparatus of claim 1, wherein the signal modulating unit is a pulse width modulation (PWM) unit.

7. The signal generating apparatus of claim 1, wherein the selection signal generating unit comprises a random number generator for generating at least a random control signal.

8. A signal generating method, comprising:
   processing a modulation upon an input signal to generate a modulated signal;
   generating at least a first selection signal;
   adjusting a pulse width of the modulated signal to generate an output signal according to the first selection signal, comprising:
   performing a logic operation upon the modulated signal and a specific delay signal to adjust the pulse width of the modulated signal;
   wherein the step of generating the output signal comprises:
   generating a plurality of delay signals according to the modulated signal, where the delay signals correspond to different phases respectively;
   generating the output signal according to the delay signals and the first selection signal; and
   selecting the specific delay signal from the delay signals as the output signal according to the first selection signal.

9. The signal generating method of claim 8, wherein the first selection signal is a random control signal.

10. The signal generating method of claim 8, wherein the logic operation is a logic AND operation.

11. The signal generating method of claim 8, wherein the logic operation is a logic OR operation.

12. The signal generating method of claim 8, further comprising:
generating a second selection signal and performing a logic operation upon the modulated signal and the specific delay signal to generate a plurality of pulse signals; and
selecting a specific pulse signal from the plurality of pulse signals as the output signal according to the second selection signal.

13. The signal generating method of claim 12, wherein the second selection signal is a random control signal.

14. The signal generating method of claim 12, wherein the logic operation comprises:
performing a logic AND operation upon the modulated signal and the specific delay signal to generate a first pulse signal;
performing a logic OR operation upon the modulated signal and the specific delay signal to generate a second pulse signal; and
selecting one of the first and second pulse signals as the output signal according to the second selection signal.

15. The signal generating method of claim 8, wherein the modulation is a pulse width modulation (PWM).

* * * * *